(12) United States Patent
Lin et al.

(10) Patent No.: US 9,404,970 B2
(45) Date of Patent: Aug. 2, 2016

(54) DEBUG INTERFACE FOR MULTIPLE CPU CORES

(71) Applicant: Cavium, Inc., San Jose, CA (US)

(72) Inventors: Teng Chiang Lin, San Jose, CA (US); Gerald Lampert, Hopkinton, MA (US); Nitin Prakash, Acton, MA (US); Andy Wang, Milpitas, CA (US); Bryan W. Chin, San Diego, CA (US)

(73) Assignee: CAVIUM, INC., San Jose, CA (US)

( * ) Notice: Subject to any disclaimer, the term of this patent is extended or adjusted under 35 U.S.C. 154(b) by 154 days.

(21) Appl. No.: 14/541,971

(22) Filed: Nov. 14, 2014

(65) Prior Publication Data

US 2016/0139201 A1    May 19, 2016

(51) Int. Cl.
*G06F 11/26* (2006.01)
*G01R 31/3177* (2006.01)

(52) U.S. Cl.
CPC .................................. *G01R 31/3177* (2013.01)

(58) Field of Classification Search
CPC .. G01R 31/3177; G06F 11/0724; G06F 11/26
USPC ...................................................... 714/27, 30
See application file for complete search history.

(56) References Cited

U.S. PATENT DOCUMENTS

| | | | | |
|---|---|---|---|---|
| 9,274,919 | B2* | 3/2016 | Greifeneder | G06F 9/45504 |
| 2006/0069953 | A1* | 3/2006 | Lippett | G06F 11/3636 714/25 |
| 2011/0072309 | A1* | 3/2011 | Sakai | G06F 11/362 714/35 |
| 2011/0258421 | A1* | 10/2011 | Elnozahy | G06F 11/3636 712/227 |
| 2013/0238882 | A1* | 9/2013 | Suzuki | G06F 9/30043 712/228 |
| 2016/0092327 | A1* | 3/2016 | Kang | G06F 11/26 714/33 |

* cited by examiner

*Primary Examiner* — Chae Ko
(74) *Attorney, Agent, or Firm* — pkalousek.ip

(57) ABSTRACT

A system includes processor cores that receive packets over a debug bus. The cores execute transactions in response to the packets. The packets are one of several types of packets such as a Second Access Bus (SAB) packet and Debug Access Bus (DAB) packet. The cores include specified resources and non-specified resources. A core that executes a transaction in response to a SAB packet accesses a non-specified resource and a core that executes a transaction in response to a DAB packet accesses a specified resources. A debug specification identifies the specified resources as being accessible by a debug controller. The debug specification does not identify the non-specified resources as being accessible by the debug controller.

30 Claims, 4 Drawing Sheets

| Requestor security state | CAB enabled? | CAB Non-Secure enabled? | Accessed resource state | Result |
|---|---|---|---|---|
| Secure | No | No | Secure | Reject |
| Secure | No | No | Non-secure | Reject |
| Secure | No | Yes | Secure | Reject |
| Secure | No | Yes | Non-secure | Reject |
| Secure | Yes | No | Secure | Allow |
| Secure | Yes | No | Non-secure | Allow |
| Secure | Yes | Yes | Secure | Allow |
| Secure | Yes | Yes | Non-secure | Allow |
| Non-secure | No | No | Secure | Reject |
| Non-secure | No | No | Non-secure | Reject |
| Non-secure | No | Yes | Secure | Reject |
| Non-secure | No | Yes | Non-secure | Reject |
| Non-secure | Yes | No | Secure | Reject |
| Non-secure | Yes | No | Non-secure | Reject |
| Non-secure | Yes | Yes | Secure | Reject |
| Non-secure | Yes | Yes | Non-secure | Allow |

Figure 4

DEBUG INTERFACE FOR MULTIPLE CPU CORES

FIELD

The present invention relates to debugging multiple cores and particularly, to accessing the cores during debugging.

BACKGROUND

A variety of systems make use of multiple cores such as the cores of a multi-core processor. The cores are each based on reduced instruction set computing (RISC) architectures such as the ARM (Advanced RISC Machine) architecture. When debugging these systems, a debug controller can be connected to the system through a port such as a JTAG debug port. The port generally places the debug controller in communication with a debug bus that is also in communication with each of the cores. In the ARM debug architecture, the debug controller and the cores are arranged in a bus topology.

During the debug process, the debug controller uses this debug bus to access various debug resources on the different cores for various transactions such as read and write. When the cores are ARM cores, the debug bus is also used for other sideband functions related to the debugging process. For instance, the debug bus can carry authentication signals that allow or disallow operation of various debug features. As the number of cores in communication with the debug bus increases, implementing the various different functions of the debug bus becomes a challenge due to the increasing number of bus wires that are required to implement these sideband functions.

Additionally, a debug architecture and/or a debug specification specifies which resources can be accessed during the debug process. However, during the debug process, it is often useful and/or desirable to access resources that the debug architecture does not identify as being accessible. Since these resources are not specified as being accessible, they cannot be accessed over a debug bus operating according to the debug specification.

There is a need for a debug system that can provide a debug controller with efficient access to resources within an increasing number of ARM cores. Additionally or alternately, there is a need for a mechanism for accessing resources that a debug architecture and/or a debug specification does not identify as being accessible over a debug bus.

SUMMARY

A system includes processor cores that receive packets over a debug bus. The cores execute transactions in response to the packets. The packets are one of several types of packets such as a Second Access Bus (SAB) packet and Debug Access Bus (DAB) packet. The cores include specified resources and non-specified resources. A core that executes a transaction in response to a SAB packet accesses a non-specified resource and a core that executes a transaction in response to a DAB packet accesses a specified resources. A debug specification identifies the specified resources as being accessible by a debug controller. The debug specification does not identify the non-specified resources as being accessible by the debug controller.

Another embodiment of a system includes nodes connected in a loop network by a debug bus. The nodes include processor cores based on an Advanced RISC Machine (ARM) specification. The debug bus is a serial one-wire bus operated consistently with the ARM debug interface specification.

Debugging methods are also disclosed. One embodiment of a debugging method includes employing a Debug Access Bus (DAB) to access specified resources from within processor cores that are each in communication with a debug bus. Another embodiment of the debug method includes employing a Second Access Bus (SAB) to access non-specified resources within the processor cores. The debug bus is a physical bus and the DAB and the SAB are each a logical bus operated via the debug bus. The specified resources are each a resource that a debug specification identifies as being accessible by a debug controller. The non-specified resources are each a resource that the debug specification does not identify as being accessible by the debug controller.

BRIEF DESCRIPTION OF THE FIGURES

FIG. 4 is a logic table showing the outcome of applying security variables to a request for access to the debug bus.

DESCRIPTION

A debug bus connects nodes in a loop or ring configuration. The nodes can include multiple processor cores and a debug controller. The debug bus can be a one-wire bus. The cores can be cores that are based on reduced instruction set computing (RISC) architectures such as the ARM (ARM (Advanced RISC Machine)) specification (an ARM core). Debug transactions that are set forth in the debug interface specification can be executed on the debug bus. Additionally, the cores and debug controller can use the debug bus to execute one or more additional transactions that permit the sideband functions to be performed on the one-wire bus and are consistent with the debug interface specification. Since the specified functions and the sideband functions are executed over the one wire bus, increasing the number of cores does not require an increasing number of wires included in the bus. Accordingly, the debug bus remains efficient as the number of cores increases.

The cores and/or debug interface can be configured to operate more than one logical bus. One of the logical busses can be used to access resources that are within the cores and that are specified as being accessible by a debug interface specification. Another one of the logical busses can be used to access resources that are within the cores but are not specified as being accessible by a debug interface specification. These logical busses can be operated over the same physical bus. For instance, in some instances, these logical busses are operated over the one wire debug bus that connects the nodes in a loop or ring. As a result, the debug bus can also be used to access debug resources that are identified in the debug interface specification and also debug resources that are not identified in the debug specification.

Figure 1:
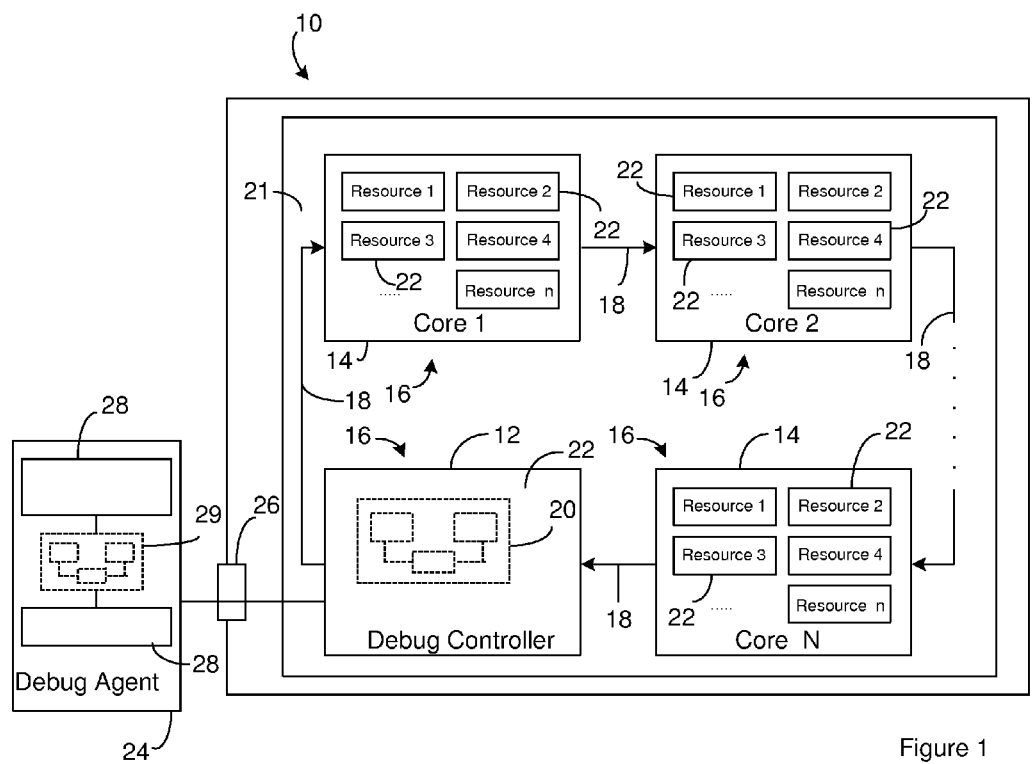
FIG. 1 is a block diagram of a debug system that includes a debug controller and processor cores connected in a loop by a debug bus.

FIG. 1 is a block diagram of a system that includes a device 10 having a debug controller 12 and multiple processor cores 14. Examples of devices 10 having debug controllers and multiple processor cores include, but are not limited to, multiprocessor cores such as Cavium's CN88xx. The device 10 includes multiple nodes 16 arranged in a loop or ring network.

A debug bus 18 connects the nodes 16 in a daisy chain fashion such that each node 16 is connected to two other nodes 16 so as to form a single continuous pathway for signals through each node 16. The debug bus 18 can include, consist of, or consist essentially of a one-wire bus and can be a serial bus. The debug bus protocol can be a serial packet protocol. During operation of the system, packets travel from node 16 to node 16 with each node 16 handling each packet. The loop or ring configuration means that the each packet returns to the node 16 that originated the packet unless another node 16 removes that packet from the debug bus 18.

The nodes 16 include the debug controller 12 and the processor cores 14. The cores 14 are shown as positioned on the same chip 21 but can be positioned on different chips. The cores 14 each include a processor (not shown) that executes instructions stored in one or more memory devices (not shown). The cores 14 can be the cores 14 of a multi-core processor. Each core 14 includes one or more resources 22 that it is desirable to access during the debug process. Examples of different resource types that can be included in one or more of the cores 14 include, but are not limited to, registers such as debug registers and trace registers, performance monitoring units, and trigger interfaces. The number of cores 14 can be as low as two but the system is configured to support large core numbers such as more than 20, 40, 48, 100, or 200. In some instances, the system includes more than 2, 20, 40, 48, 100, or 200 cores in the loop configuration and the debug bus is a one-wire bus. Alternately, the debug bus can include more than one wire. In some instances, the debug bus includes more than one wire and is a serial bus in that the number of wires in the debug bus is less than the number of bits in the largest packets transmitted on the bus or is less than half the number of bits in the largest packets transmitted on the bus. Accordingly, the debug bus can include less than 64, less than 32, less than 16, or less than 8 wires. In some instances, the above debug busses exclude control wires in that the debug bus consists of or consists essentially of data wires. In some instances, the system includes more than 2, 20, 40, 48, 100, or 200 cores in the loop configuration and the debug bus includes one wire or includes more than one wire that comprises a serial bus.

One, more than one, or all of the cores 14 can be based on reduced instruction set computing (RISC) architectures such as the ARM (ARM (Advanced RISC Machine)) architecture (an ARM core). In one example, the cores 14 are each an ARM core. An ARM core uses an instruction set architectures for computer cores based on a reduced instruction set computing (RISC) architecture developed by the British company ARM Holdings. The ARM core specification can be found at www.arm.com. In some instances, the ARM core supports a 32-bit address space and 32-bit arithmetic. In some instances, the ARM core supports a 64-bit address space and 64-bit arithmetic.

Each core 14 in the loop or ring is associated with one or more addresses and/or one or more ranges of addresses. Accordingly, a particular core 14 can be identified through the use of an address that is uniquely associated with that core 14. The resources 22 within a type of resource are also each associated with one or more resource addresses. As will become evident below, a resource address can be associated with more than one resource 22 within a resource type. For instance, different copies of a debug register can have the same resource address. However, resources 22 associated with the same resource address can also be associated with different security classifications. Accordingly, a combination of resource type, resource address, and security classification combines to provide a unique address within a core 14 and a combination of resource type, address, and security classification combines to provide a unique address within the group of cores 14.

The debug controller 12 includes electronics 20 that control the operation of the debug controller 12 so as to perform the functions and processes described herein. In some instances, the debug controller 12 performs one, more than one, more than two, or all of the functions selected from the group consisting of stop execution of a program being executed by one or more of the cores 14, examine and alter a state of the cores 14, examine and alter memory and input/output peripheral state, and restart the cores 14.

A debug agent 24 is in communication with the debug controller 12 through a debug port 26 such as a JTAG debug port. In some instances, the debug agent 24 is configured to be removably attached to the debug port 26. Accordingly, the debug agent 24 can be an external device although an internal debug agent 24 is also possible. In some instances, the debug agent includes or consists of software running on a processor core such as core 14. Multiple debug agents are also possible. The debug agent 24 optionally includes one or more user interfaces 28 in communication with electronics 29 that control the operation of the debug controller 12 so as to perform the functions and processes described herein. Examples of suitable user interfaces 28 include, but are not limited to, displays, keyboards, mice and other cursor controllers. The debug port 26 is shown as being separate from the chip 21, however, the chip 21 can include the debug port 26. In some instances, the debug controller 12 permits an operator to perform one, more than one, more than two, or all of the functions selected from the group consisting of stop execution of a program being executed by one or more of the cores 14, examine and alter a state of the cores 14, examine and alter memory and input/output peripheral state, and restart the cores 14.

Figure 2:
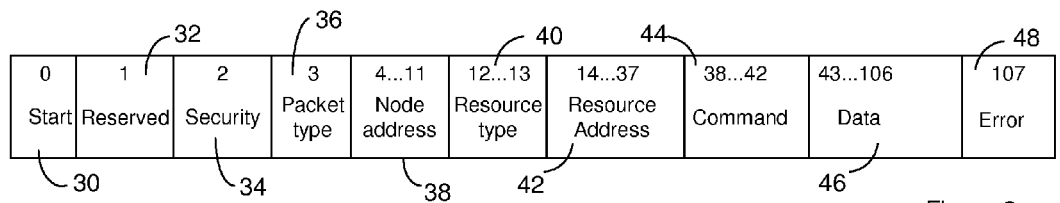
FIG. 2 illustrates one example of a packet format that is suitable for use on the debug bus.

FIG. 2 illustrates one example of a packet format that is suitable for use on the debug bus 18. The packet includes a start field 30, a reserved field 32, a security field 34, a packet field 36, a node address field 38, a resource type field 40, an address field 42, a command field 44, a data field 46, and an error field 48. The numbers shown in the packets can indicate the number of bits in each field and the sequence of bits in the packet.

The start field 30 indicates the start of the packet. The packet field 36 indicates the logical bus associated with the packet. For instance, as will be discussed in more detail below, the packet field 36 can indicate whether logical bus is Debug Access Bus (DAB) or Second Access Bus (SAB). The DAB allows the debug controller 12 to access resources 22 that the debug interface specification and/or debug interface architecture specifies are accessible during debug. In contrast, the SAB is a logical bus that allows the debug controller 12 to access resources 22 that are not identified as being accessible by the debug interface specification and/or debug interface architecture. Accordingly, the one or more bits in the packet field 36 can indicate whether the packet is a DAB packet or a SAB packet.

The node address field 38 can list the address of a particular one of the nodes 16 such as a particular core 14. The resources type field indicates the type of resource 22 within a core 14. The address field 42 indicates an address within the resource 22 identified in the resource type field 40. Examples of resource types include, but are not limited to, registers such as debug registers and trace registers, performance monitoring units, and trigger interfaces. When the packet is a SAB packet, the security field 34 can indicate the security classification of the resource associated with address field 42. In some instances, multiple copies of a resource such as a register have the same address but have different security classifications. As will be discussed in more detail below, when multiple resources 22 have the same address, the security classification can be employed to determine which of the resources 22 is being identified in the packet. The command field 44 indicates the type of transaction that is to be executed by the core 14 receiving the packet. For instance, one or more bits in the command field 44 can indicate whether the packet is directed to a read transaction or a write transaction, or a poll transaction or a broadcast transaction. The data field 46 generally includes the data exchanged as a result of the transaction. Examples of transactions include, but are not limited to, read, write, poll, and broadcast.

The debug controller 12 can use the packet to perform traditional debug transactions specified by the debug interface specification and/or debug interface architecture. For instance, the controller can send read operations and/or write to a particular one of the cores 14. For instance, when sending a read transaction according to the debug interface specification and/or debug interface architecture, the debug controller 12 can generate a packet on the debug bus 18 such that one or more bits that indicate a DAB packet are placed in the packet field 36, one or more bits that indicate the address of the particular core 14 being addressed are placed into the node address field 38, one or more bits that indicate the resource type from which the data is to be read is placed in the resource type field 40, one or more bits indicating the address of the data within the resource type is placed into the address field 42, one or more bits indicating a read transaction are placed in the command field 44, and one or more bits indicating that there are no errors currently in the transaction are placed in the error field 48. When sending a write transaction according to the debug interface specification and/or debug interface architecture, the debug controller 12 can generate a packet on the debug bus 18 such that one or more bits associated with a DAB packet are placed in the packet field 36, one or more bits for the address of the particular core 14 being addressed is placed into the node address field 38, one or more bits associated with the resource type where data is to be written is placed in the resource type field 40, the bits for the address where the data is to be written is placed into the address field 42, one or more bits indicating a write transaction are placed in the command field 44, and one or more bits indicating that there are no errors currently in the transaction are placed in the error field 48.

Figure 3:
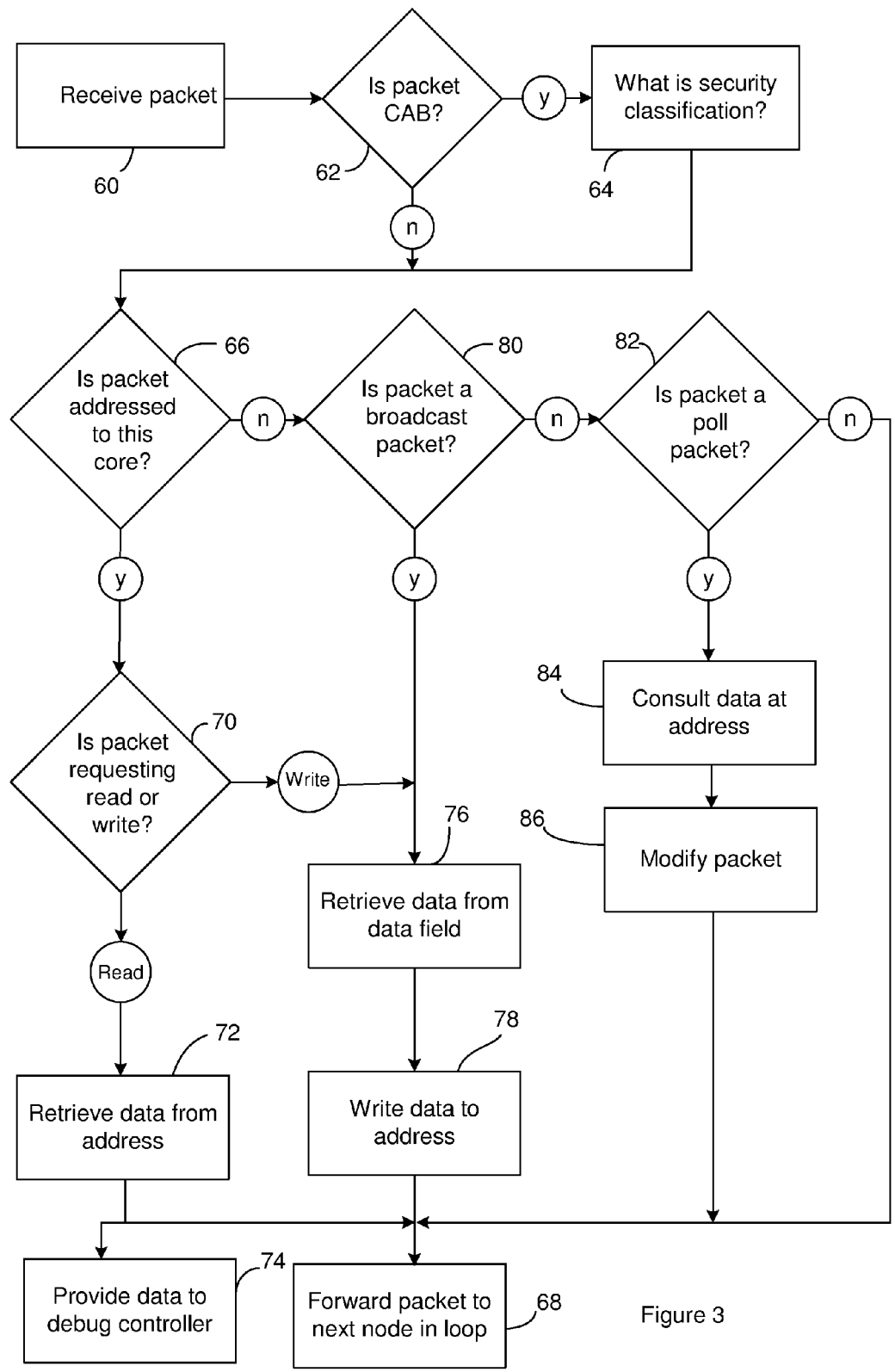
FIG. 3 illustrates a possible process flow that each core can use in response to receipt of a packet from the debug bus.

The packet generated by the debug controller 12 travels around the loop from node 16 to node 16. As the packet travels around the loop, each core 14 handles the packet. FIG. 3 presents a process flow that each core 14 can use in response to receipt of a packet from the debug bus 18. At process block 60 the core 14 receives the packet. At determination block 62, the core 14 determines the packet type. When the core 14 determines that the packet is a SAB type packet, the core 14 proceeds to process block 64 where the core 14 consults the security field 34 to determine the security classification of the resource 22 having the address specified in the address field 42.

At determination block 66, the core 14 determines whether the packet is addressed to that core 14. For instance, the core 14 can determine whether its address matches the address in the node address field 38. A core 14 that does not find a match proceeds to process block 68 and passes the packet on to the next node 16 in the loop. A core 14 that finds a match proceeds to determination block 70 where the core 14 determines whether packet is requesting a read transaction or a write transaction. For instance, the core 14 can consult the command field 44 to determine whether the command field 44 includes the one or more bits associated with a read transaction or the one or more bits associated with a write transaction.

When the core 14 determines that the packet is directed to a read transaction, the core 14 proceeds to process block 72 where the core 14 retrieves the requested data. For instance, the core 14 can retrieve that data indicated in the address field 42 from the resource 22 listed in the resource type field 40. The core 14 proceeds to process block 74 and process block 68. At process block 68, the core 14 forwards the packet to the next node 16 in the loop. Since the packet proceeds from one node 16 to the next, the packet eventually returns to the debug controller 12. At process block 74, the core 14 provides the retrieved data to the debug controller 12. For instance, the core 14 can generate a response packet on the debug bus 18. The response packet can include the retrieved data. As with the original packet, the response packet is passed from one core 14 to another until the response packet is received at the debug controller 12.

As noted above, the read transaction can involve a core 14 originating a packet (the response packet) on the debug bus 18. As is evident from this discussion, the response packet was generated in response to an inquiry from the debug controller 12. The debug controller 12 can be operated such that when the debug controller 12 generates a packet that requires a response over the debug bus 18, the debug controller 12 does not generate additional packets on the debug bus 18 until the response packet is received. Additionally, the debug bus 18 can also be operated such that the cores 14 do not generate packets on the debug bus 18 unless responding to a packet from the debug controller 12. As a result, the debug bus 18 is available to receive the response packet from the core 14 that received the packet with the read transaction.

When the core 14 determines that the packet is directed to a write transaction, the core 14 proceeds from determination block 70 to process block 76. At process block 76, the core 14 retrieves the data from the data field 46 of the packet and proceeds to process block 78. At process block 78 the core 14 writes the retrieved data to the address identified in the address field 42 of the packet in the resource 22 listed in the resource type field 40. The core 14 then proceeds to process block 68 where the core 14 forwards the packet to the next node 16 in the loop. Since the packet proceeds from one node 16 to the next, the packet eventually returns to the debug controller 12. The return of the packet indicates successful completion of the write transaction.

In addition to the traditional read and write transactions, the above debug bus 18 and packet can be used to perform the sideband functions. For instance, the debug controller 12 can perform a broadcast transaction where the same data is sent to each of the cores 14. When this embodiment is enabled, the debug controller 12 places into the node address field 38 a code that indicates the packet is a broadcast packet, the one or more bits associated with a DAB packet are placed in the packet field 36, the one or more bits associated with the write command or one or more bits associated with a broadcast command are placed in the command field 44, the one or more bits associated with the resource type where the data is to be written is placed in the resource type field 40, the address where data is to be written in the specified resource type is placed into the address field 42, and the data that is to be written is placed in the data field 46. As a result, the broadcast packet is essentially a packet for a write transaction that is directed to each of the cores 14 in the loop.

FIG. 3 also illustrates the operation of the cores 14 in response to the debug controller 12 placing a broadcast packet on the debug bus 18. For instance, when a core 14 determines that a packet is not addressed to that core 14 at determination block 66, the core 14 proceeds to determination block 80 where it determines whether the packet is a broadcast. For instance, each core 14 can store the same broadcast code. Each core 14 can compare the broadcast code to the code in the node address field 38. When the codes match, the core 14 can determine that the packet is a broadcast. Since each core 14 stores the same broadcast code, each core 14 in the loop will either determine that the packet is a broadcast packet or each core 14 in the loop will determine that the packet is not a broadcast packet.

When a core 14 determines that the packet is a broadcast packet, the core 14 proceeds to process block 76 where the core 14 retrieves data from the data field 46 of the packet. The core 14 proceeds to process block 78 where the core 14 writes the retrieved data to the address identified in the address field 42 of the packet for the resource 22 identified in the resource type field 40. The core 14 then proceeds to process block 68 where the core 14 forwards the packet to the next node 16 in the loop. Since the packet proceeds from one node 16 to the next, the packet eventually returns to the debug controller 12. The return of the packet indicates successful completion of the broadcast transaction.

The debug controller 12 can perform a poll transaction where the debug controller 12 requests the same data from each of the cores 14. When this embodiment is enabled, the debug controller 12 places into the node address field 38 a code that indicates the packet is a poll packet, the one or more bits associated with a DAB packet are placed in the packet field 36, the one or more bits associated with the read command or one or more bits associated with a poll command are placed in the command field 44, the one or more bits associated with the resource type where the data is to be written is placed in the resource type field 40, the address of the data to be read is placed into the address field 42. As a result, the poll packet is essentially a packet for a read transaction that is directed to each of the cores 14 in the loop.

FIG. 3 illustrates the operation of the cores 14 in response to the debug controller 12 placing a packet for a poll transaction on the debug bus 18. FIG. 3 illustrates that when a core 14 determines that a packet is not a broadcast transaction at determination block 80, the core 14 proceeds to determination block 82 where it determines whether the packet is directed to a poll transaction. For instance, each core 14 can store the same poll code. Each core 14 can compare the poll code to the code in the node address field 38. When the codes match, the core 14 can determine that the packet is directed to a poll transaction. Since each core 14 stores the same poll code, each core 14 in the loop will either determine that the packet is a poll packet or each core 14 in the loop will determine that the packet is not a poll packet. In some instances, the address in the node address field 38 is the same for both the poll transaction and the broadcast transaction. In these instances, when the core consults node address field 38 at block 80 or 82, the core recognizes that the packet is directed to a poll transaction or a broadcast transaction. As a result, the core can then consult the command field 44 to determine whether the packet is directed to the poll or to the broadcast. For instance, when the command field 44 indicates a write or a broadcast, the core determines that the packet is directed to a broadcast transaction and when the command field 44 indicates a read or a poll, the core determines that the packet is directed to a poll transaction.

When a core 14 determines that the packet is not directed to a poll transaction, the core 14 proceeds to process block 68 where the core 14 forwards the packet to the next node 16 in the loop. When the core 14 determines that the packet is directed to a poll transaction, the core 14 proceeds to process block 84 where the core 14 retrieves requested data. For instance, the core 14 can retrieve that data indicated in the address field 42 from the resource 22 listed in the resource type field 40. The core 14 proceeds to block 86 where the core 14 modifies the packet in a form that properly responds to the poll packet. For instance, the core 14 can modify the data field 46 of the packet to include the retrieved data or to include data that indicates the status of the retrieved data. As an example, the data stored at the address recited in the address field 42 can indicate the debug status of each core 14 and the poll transaction can effectively request the debug status of each core 14. Each core 14 can modify the data field 46 of the poll packet to reflect its debug status. The core 14 then proceeds to process block 68 where the core 14 forwards the packet to the next node 16 in the loop. Since the packet proceeds from one node 16 to the next, the packet eventually returns to the debug controller 12 which can extract the retrieved data from the data field 46 of the packet.

As is evident from the above discussion, when the debug controller 12 performs a polling transaction, each core 14 in the loop can modify the data field 46 of the packet for the poll transaction. In order to prevent different cores 14 from overwriting one another different portions of the data field 46 can be associated with different cores 14. For instance, bit 43 can be associated with the first core 14, bit 44 can be associated with the second core 14, and son on until the Nth core 14 is associated with bit 42+N. Accordingly, the debug controller 12 can access the data field 46 bits associated with a particular core 14 to retrieve the requested data for that core 14.

As is evident from the above discussions, the packets originated by the debug controller 12 proceed from one node 16 to the next and eventually returns to the debug controller 12. If a core 14 experiences an error of some type as the packet is routed along the loop, the core 14 can modify the error field 48 of the packet to include one or more bits that indicate this error. In contrast, if the core 14 does not experience an error, the core 14 does not modify the error field 48. If a core 14 finds that the error field 48 has already been modified so as to indicate an error, the core 14 does not modify the error field 48 further so that the error indication is returned to the debug controller 12. As a result, when the packet returns to the debug controller 12, the debug controller 12 can access the error field 48 to determine whether there were any errors during the execution of the transaction. Examples of errors that can occur when executing the above transactions include, but are not limited to, a parity error or an internal error in core 14 that prevents it from performing the transaction.

The debug bus 18 can be operated according to a debug architecture and/or a debug specification. A debug architecture and/or a debug specification specifies which resources 22 can be accessed during the debug process. However, during the debug process it is often desirable to access resources 22 that are included in one or more cores 14 on the loop but that are not specified by the debug architecture and/or a debug specification. The debug bus 18 can also be used to access these resources 22 by using a separate logical bus called the Second Access Bus (SAB) below. Accordingly, the SAB and the DAB are different logical busses that both use the debug bus 18. For instance, the SAB and the DAB are different logical busses that both use the same debug bus 18.

The debug controller 12 can employ a SAB packet to perform the same transactions as are described for the DAB. For instance, the debug controller 12 can employ a SAB packet to perform transactions such as read, write, poll, and broadcast. When performing these transactions, the debug controller 12 places the bits into the fields of the packet as described in the context of the DAB packet but uses the packet field 36 to distinguish the SAB packet from the DAB packet and uses the security field 34 to identify the security classification of the resource 22 having the address set forth in the address field 42. For instance, when placing a SAB packet on the debug bus 18, the debug controller 12 places the one or more bits associated with a SAB packet in the packet field 36. Additionally, the debug controller 12 identifies the security classification of the resource 22 having the address set forth in the address field 42 and places into the security field 34 the one or more bits associated with the appropriate security classification.

The process flow of FIG. 3 can also illustrate how the cores 14 respond to receipt of a SAB packet. However, when the cores 14 access the address recited in the address field 42 (i.e. process block 72, process block 78, and process block 84), the cores 14 consult the version of the resource 22 having the specified address and also having the associated security classification. More specifically, the cores 14 access the resource 22 having the address set indicated in the address field 42 of the SAB packet and also having the security classification indicated in the security field 34. This is a contrast with the address accessed when a core 14 receives a DAB packet. In the case of a DAB packet, the core 14 consults the address that that is specified by the debug interface specification and/or debug interface architecture. For instance, when a debug interface specification and/or debug interface architecture specifies that non-secure registers are accessed during debug, the cores consult a non-secure register having the address in the address field 42. The SAB packet may permit access to the secure register with this address even though the debug interface specification and/or debug interface architecture does not specify this access. Accordingly, the SAB permits the debug controller 12 to access debug resources that are not generally available through the debug interface specification and/or debug interface architecture.

The debug controller 12 can originate a SAB packet on the debug bus 18 or can place a SAB packet on the debug bus 18 in response to a request packet from another entity. Examples of other entities that can originate a request packet include, but are not limited to, cores and the debug agent 24. The cores can be included in the loop or located elsewhere in the system. As noted above, the debug bus 18 can be operated such that the cores 14 included in the loop do not generate packets on the debug bus 18 unless responding to a packet from the debug controller 12. As a result, a request packet received at the debug controller 12 can be transmitted to the controller through a communications mechanism other than the debug bus 18. For instance, a core can transmit to the debug controller 12 a request packet over a bus such as an I/O bus.

The debug controller 12 treats the request packets as a request to use the SAB to perform a transaction specified in the request packet. As will be described in more detail below, the debug controller 12 processes the request packets and determines whether to allow the request packet or to reject the request. When the debug controller 12 rejects the request, the debug controller 12 can return to the requesting entity a response packet that indicates an error. When the debug controller 12 allows the request, the debug controller 12 places on the debug bus 18 a SAB packet that performs the transaction specified in the request packet. The transactions requested in request packets can be the same as the transactions discussed above. Examples of transactions that can be the subject of request packets include, but are not limited to, read, write, poll, and broadcast. When the debug controller 12 receives confirmation of a successful transaction, the debug controller 12 can transmit to the requesting entity a response packet indicating the success of the transaction. Additionally or alternately, when the debug controller 12 receives data in response to a transaction such as would occur for a read transaction or a poll transaction, the debug controller 12 can transmit to the requesting entity a response packet that provides the received data to the requesting entity. The debug controller 12 can transmit the response packet to the requesting entity using the same communications mechanism on which the request packet was received or on a different communications mechanism that is a communications mechanism other than the debug bus 18.

In some instances, a request packet has the format disclosed in the context of FIG. 2. For instance, the request packet has the same sequence, size and selection of fields. Further, the requesting entity can fill in the fields of the request packet as described above in the context of the debug controller 12. In these instances, when the debug controller 12 allows the requested transaction, the debug controller 12 can place the received request pack onto the debug bus 18. As a result, the request packet received by the debug controller 12 can be the same as the resulting SAB packet placed on the debug bus 18 by the debug controller 12. Alternately, the debug controller 12 can modify the request packet or the content of the request packet into the form of the SAB packet. Alternately, a request packet can have a format that is different from the format disclosed in the context of FIG. 2 and the debug controller 12 can generate the SAB packet from information provided in the request packet.

As noted above, the debug controller 12 accepts or rejects the transaction requested by a request packet. In determining whether to accept or reject a requested transaction, the debug controller 12 can take into consideration one, two or three variables selected from the group consisting of the security state of the requestor, a SAB enable variable, a non-secure SAB enable, and the security states of the resource 22 accessed as a result of the requested transaction.

The "security state of the requestor" variable indicates the security state in which the entity sending the request packet (requestor) is operating. In many debug specifications and/or debug architectures such as the ARM debug interface specification, a portion of the cores 14 may be configured to operate in secure a state and a portion of the cores 14 may be configured to operate in a non-secure state. A core 14 operating in the secure state can be distinguished from a core 14 operating in the non-secure state by a secure register bit. Only a core 14 operating in secure state may change its security state. Secure state may be protected by authentication mechanisms such that access to secure state is restricted by mechanisms such as secure keys. The following discussion treats the security states of a core 14 as limited to two security states (secure and non-secure) in order to simplify the following discussion; however, it is understood that cores 14 can be operated in many more than two security states. Accordingly, the "security state of the requestor" variable indicates the security state in which the core 14 sending the request packet is operating.

The SAB enable variable is a variable that indicates whether the SAB is enabled for all SAB transactions. The "non-secure SAB enable" variable is a variable that indicates whether the SAB is enabled for access by a non-secure requestor.

The variable called "security states of the resource accessed" indicates the security state of the resource 22 that is to be accessed during the requested transaction. Various resources 22 within a debug specification and/or debug architecture such as an ARM debug interface specification are classified in one of several security states. For instance, registers in a core 14 can be banked such that multiple copies of a register have the same address. These copies may be images of one another, or completely separate registers, or formed from a combination of mirrored state and independent (by security state) state. When registers are banked, one of the copies is classified as a secure copy and the other can be classified as a non-secure copy. Since these copies have the same address but different security states, the security state can be used to distinguish between registers having the same address. Accordingly, when multiple resources 22 have the same address, the variable called "security states of the resource accessed" can be used to identify the correct resource 22. Accordingly, the "security states of the resource accessed" corresponds to the value of the one or more bits in the security field 34 of the packet. For instance, when the resource 22 to be accessed are non-secure, the security field 34 of the packet can include the one or more bits associated with a non-secure resource 22 and when the resource 22 to be accessed is secure, the security field 34 of the packet can include the one or more bits associated with a secure resource.

A resource 22 classified as secure can be distinguished from a resource 22 classified as non-secure by its restricted access. In some instances, when in non-debug operation, a secure resource 22 that is part of a core 14, may only be accessed by software running on the core 14 while that core is configured in secure state.

The system can employ one or more a security mechanisms that limit the use of the SAB by different entities. For instance, in a first security mechanism, the debug controller 12 can employ the SAB enable variable alone or in combination with other variables to determine whether the transaction specified in the request packet is rejected or allowed. In one example, when the SAB enable variable indicates that the SAB is not enabled, the debug controller 12 rejects all transactions originated by request packet. In a second security mechanism, the debug controller 12 can employ the SAB enable variable alone or in combination with other variables to determine whether the transaction specified in the request packet is rejected or allowed. In an example, when a requestor is operating in a non-secure state and the "non-secure SAB enable" indicates that the SAB is not enabled for non-secure requestors, the debug controller 12 can reject the request packet regardless of the state of the SAB enable variable. In a third security mechanism, the debug controller 12 can employ the variable called "security state of the requestor" and/or the variable called "security states of the resource accessed" alone or in combination with other variables to determine whether the transaction specified in the request packet is rejected or allowed. As an example, when the requestor is operating in a non-secure state and is requesting a transaction that requires access to a resource 22 that is classified as secure, the debug controller 12 can reject the requested transaction. The debug controller 12 can make use of any one, two, or three security mechanisms selected from the group consisting of the first security mechanism, the second security mechanism, and the third security mechanism. In some instances, the debug controller 12 uses all three security mechanisms. In these instances, the debug controller 12 allows the transactions requested in a request packet that are not rejected by any of the first through third security mechanisms. The results of applying the first through third security mechanisms are illustrated in the logic table shown in FIG. 4. In some instances, the debug controller 12 is configured to operate so as to generate the results shown in column 4 of Table 1. As is evident from FIG. 4, the SAB makes it possible for a secure entity to access a secure resource 22 or a non-secure resource 22; however, a non-secure entity can only access non-secure resources 22. In instances where the debug controller 12 uses all three security mechanisms, the debug controller 12 can apply additional security mechanisms that result in the rejection of additional transaction requests.

Figure 5:
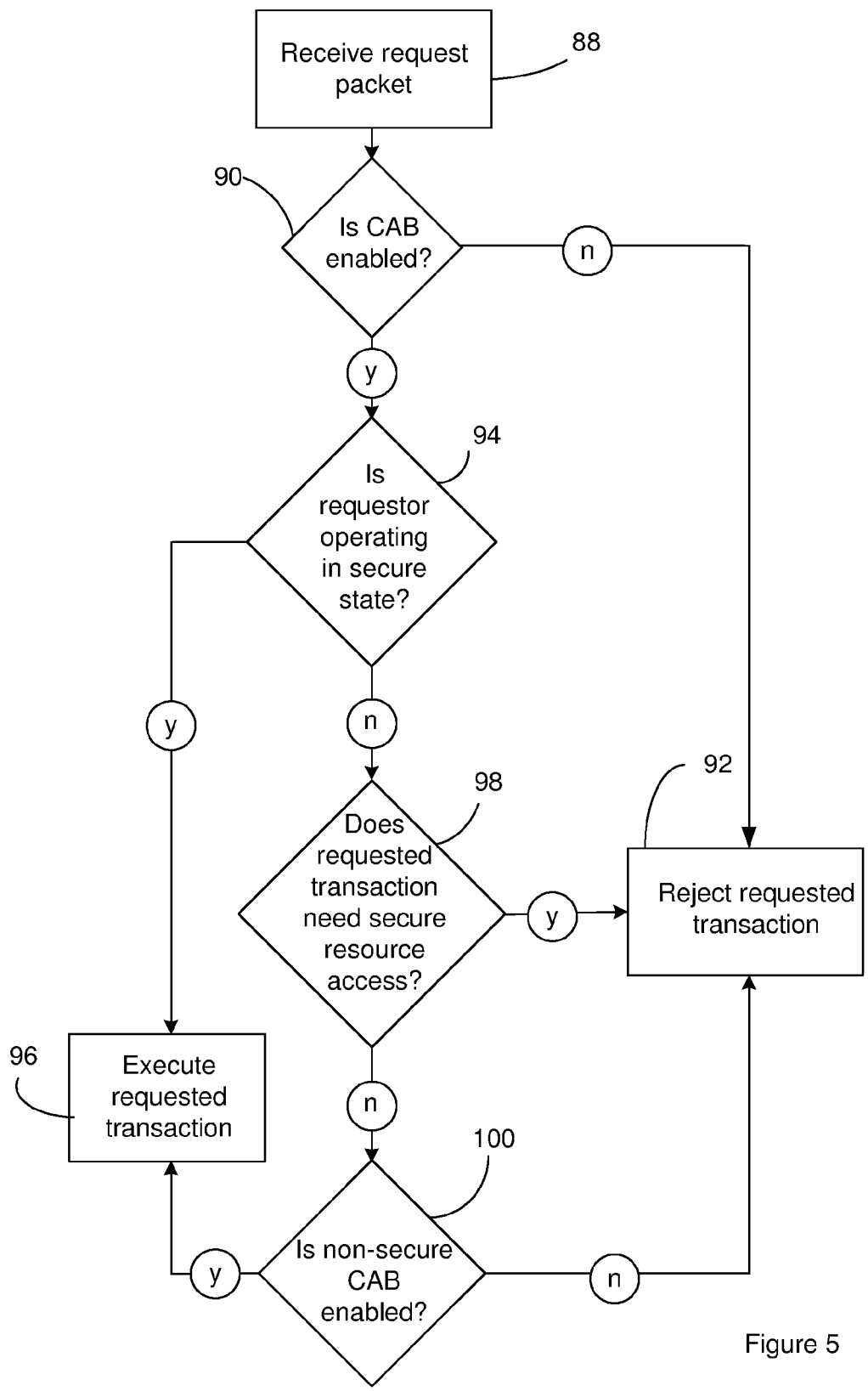
FIG. 5 illustrates a process flow that can be employed to achieve the results specified in FIG. 4

FIG. 5 presents a process flow that can represent one method of operating the debug controller 12 so as to achieve the results specified in FIG. 4. At process block 88, the debug controller 12 receives a request packet. The debug controller 12 proceeds to determination block 90 where it determines if the SAB is enabled. When the determination is negative, the debug controller 12 rejects the request package at process block 92. When the determination is positive, the debug controller 12 proceeds to determination block 94 where it determines if the requestor is operating in secure state. When the determination is positive, the debug controller 12 attempts to execute the requested transaction at process block 96. When the determination is negative, the debug controller 12 proceeds to determination block 98 where it determines if executing the requested transaction requires access to a resource 22 that is classified as secure. When the determination is positive, the debug controller 12 rejects the request package at process block 92. When the determination is negative, the debug controller 12 proceeds to determination block 100 where it determines if the non-secure SAB is enabled. When the determination is negative, the debug controller 12 rejects the request package at process block 92 and when the determination is positive, the debug controller 12 attempts to execute the requested transaction at process block 96.

When applying the security mechanisms described above, the debug controller 12 has access to one or more of the variables selected from the group consisting of the security state of the requestor, SAB enable, a non-secure SAB enable, and the security states of the accessed resource 22. The SAB enable variable and the non-secure SAB enable variable may be set by a mechanism such as secure pins on the chip 21 or device 10 or a secure register that may only be written by a core 14 operating in secure state or a by a core or processor not included on the bus 18. The status of SAB enable and/or non-secure SAB enable may be provided to the debug controller 12 over some dedicated signals to the debug controller 12 using a communications mechanism other than the bus 18. The debug controller 12 determines the security state of the requestor and the security state of the accessed resource 22 from the request packet. For instance, when the request packet has a format in according with FIG. 2, the one or more bits in the security field 34 can indicate the security state of the requestor. Additionally or alternately, a single bit in the request packet can indicate the security classification of the accessed resource 22. For instance, a 0 indicates that the accessed resource 22 is classified with the same security state as the requestor and a 1 indicates that the accessed resource is classified with a different security state from the requestor. As an example, when the security field 34 indicates that the requestor operates in the secure state and the bit is a one, the bit indicates that the requested transaction will access a resource classified as non-secure. As a result, an upper address bit in the address field 42 can indicate the security states of the accessed resource. For instance, bit A35 can indicate the security states of the accessed resource.

The above discussion shows that when the request packet has a format in according with FIG. 2, the one or more bits in the security field 34 of the request packet can serve a different function that the one or more bits in the security field 34 of the SAB packet. For instance, the security field 34 of the request packet indicates the security state in which the requestor is operating where the security field 34 of the SAB packet indicates the security classification of the accessed resource. As a result, in instances where the debug controller 12 forwards a request packet to the debug bus 18 as a SAB packet, the debug controller 12 can modify the request packet into a SAB packet. For instance, the debug controller 12 can modify the security field 34 so it indicates the security classification of the accessed resource rather than the security state in which the requestor is operating.

As noted above, the debug controller 12 can initiate a SAB packet on its own or in response to a request from another entity. When initiating a SAB packet on its own, the debug controller 12 can generate a SAB package on the debug bus 18 that is not response to a request package. In these instances, the debug controller 12 can also apply all or a portion of the above security mechanisms. For instance, the debug controller 12 can treat its own security state as the security state of the requestor and the security classification of the accessed resource and the security classification of the resource the debug controller 12 will access as the security classification of the accessed resource when applying the above security mechanisms. Additionally or alternately, the debug controller 12 can also use SAB enable, a non-secure SAB enable when applying the above security mechanisms. Accordingly, when the above security mechanisms are applied, a debug controller 12 operating in the secure state may be able can use the SAB to access a secure resource or a non-secure resource depending on the value of SAB enable; however, a debug controller 12 operating in a non-secure sate may be able only access non-secure resources depending on the value of SAB enable and non-secure SAB enable.

As noted above, in some instances, one, two, or three components selected from the group consisting of the cores 14, the debug controller 12, and the debug bus 18 can be operated according to a debug architecture and/or a debug specification. In one example, the debug architecture and/or a debug specification are the ARM debug interface specification and/or the ARM debug interface architecture. In some instances, the ARM debug interface specification and/or the ARM debug interface architecture are as described at www.arm.com.

As noted above, the debug agent 24 includes electronics 29 and the debug controller 12 include electronics 20. Suitable electronics for executing the described functions can include a controller. For example, the controller can be a processor for executing programming instructions stored in the memory, e.g., a microprocessor, or a digital signal processor (DSP), or it can be implemented as one or more application specific integrated circuits (ASICs), field programmable gate arrays (FPGAs), complex programmable logic devices (CPLDs), discrete logic, software, hardware, firmware or any suitable combination thereof.

The electronics can optionally include one or more memories in communication with the controller. The memory can store data for executing the functions of the electronics, the debug controller, and/or the debug agent and/or for data storage. The memory can be any memory device or combination of memory devices suitable for read and/or write operations.

In some instances, the electronics include a computer-readable medium in communication with the controller. The computer-readable medium can have a set of instructions to be executed by the controller. The controller can read and execute instructions included on the computer-readable medium. The controller executes the instructions such that the electronics perform one or more of the described functions. The computer-readable medium can be different from the memory or can be the same as the memory. The memory can be any memory device or combination of memory devices suitable for read and/or write operations and can include optical discs such as CDs, magnetic storage diskettes, Zip disks, magnetic tapes, RAMs, and ROMs. Some functions of the electronics may be executed using hardware as opposed to executing these functions in firmware and/or software.

FIG. 3, FIG. 5 and the associated text provide diagrams that illustrate an example of a method; however, the sequence of the illustrated steps and actions can optionally be re-arranged to achieve the same or similar results. Additionally or alternately, the fields illustrated in the packets disclosed above can have a different number and/or sequence of fields. Further, the number of bits included in the different fields can be different from the illustrated numbers.

While the SAB is partially disclosed in the context of a one-wire bus that connects nodes in a loop or ring configuration, a SAB can be implemented in conjunction with other bus types and/or other node configurations.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A system, comprising:
resources within processor cores that are each in communication with a debug bus such that the cores receive packets over the debug bus,
the cores executing transactions in response to the packets,
the packets each being a type of packet selected from a group that includes Second Access Bus (SAB) packets and Debug Access Bus (DAB) packets,
the resources including specified resources and non-specified resources,
a core that executes a transaction in response to a DAB packet accesses a specified resource and a core that executes a transaction in response to a SAB packet accesses a non-specified resource,
a debug specification identifies the specified resources as being accessible by a debug controller but does not identify the non-specified resources as being accessible by the debug controller.

2. The system of claim 1, wherein the cores are based on reduced instruction set computing (RISC) architectures.

3. The system of claim 2, wherein the cores are based on an Advanced RISC Machine (ARM) specification.

4. The system of claim 1, wherein the debug specification is the Advanced RISC Machine (ARM) debug interface specification.

5. The system of claim 1, wherein the resources are debug registers.

6. The system of claim 1, wherein the cores each serve as a node of a loop network.

7. The system of claim 6, further comprising: the debug controller, the debug controller being a node on the loop network.

8. The system of claim 1, wherein the debug bus is a serial bus.

9. The system of claim 8, wherein the debug bus includes fewer wires than a number of bits in the largest packet selected from the group consisting of the DAB packet and the SAB packet.

10. The system of claim 1, wherein the de-bug bus is a one-wire bus.

11. The system of claim 9, wherein the packets include one or more bits in a packet type field, the one or more bits indicating whether the packet is DAB packet or a SAB packet.

12. The system of claim 1, further comprising: the debug controller, the debug controller placing the packets on the debug bus.

13. The system claim 12, wherein the debug controller places a packet on the debug bus in response to receiving a request from one or more of the cores.

14. The system claim 12, wherein the debug controller places a packet on the debug bus in response to receiving a request from one or more external debug agents.

15. The system claim 12, wherein the debug controller places packets on the debug bus in response to receiving requests from one or more of the cores, the debug controller rejecting a portion of the request and executing another portion of the requests in accordance with one or more security mechanisms.

16. The system of claim 15, wherein the debug controller rejects requests from a core operating in a non-secure state where a secure resource is accessed as a result of executing the request.

17. The system of claim 16, wherein the debug controller executes at least a portion of the requests from a core operating in a secure state where a secure resource is accessed as a result of executing the request and also executes at least a portion of the requests from a core operating in a secure state where a non-secure resource is accessed as a result of executing the request.

18. The system of claim 1, wherein the cores execute transactions in response to receiving packets on the debug bus, the transactions including read transactions and write transactions.

19. The system of claim 18, wherein the transactions include a poll transaction where each core modifies the same packet as the packet passes through the loop network.

20. The system of claim 19, wherein the modified packet is returned to a debug controller that acts as one of the nodes in the loop network.

21. The system of claim 19, wherein each core modifies that modifies the packet modifies a different portion of the packet.

22. The system of claim 21, wherein the portion of the packet that is modified by a core is associated with that core.

23. The system of claim 18, wherein the transactions include a broadcast transaction, the cores executing the broadcast transactions in response to receiving a broadcast packet and each core that receives the broadcast packet performs a write operation in response to receiving the broadcast packet.

24. The system of claim 23, wherein data written as part of the write operation is the same for each core that receives the broadcast packet.

25. The system of claim 23, wherein the broadcast packet is returned to a debug controller that acts as one of the nodes in the loop network.

26. A debugging method, comprising:

employing a Debug Access Bus (DAB) to access specified resources from within processor cores that are each in communication with a debug bus; and employing a Second Access Bus (SAB) to access non-specified resources within the processor cores, the debug bus being a physical bus and the DAB and the SAB each being a logical bus on the debug bus, the specified resources each being a resource that a debug specification identifies as being accessible by a debug controller, and the non-specified resources each being a resource that the debug specification does not identify as being accessible by the debug controller.

27. The method of claim 26, wherein the cores are based on reduced instruction set computing (RISC) architectures.

28. The method of claim 26, wherein the cores are based on an Advanced RISC Machine (ARM) debug interface architectures.

29. The method of claim 26, wherein the debug specification is the Advanced RISC Machine (ARM) debug interface specification.

30. The method of claim 26, wherein the cores each serve as a node of a loop network.

* * * * *